(12) United States Patent (10) Patent No.: US 7,463,181 B2
Wintermantel (45) Date of Patent: Dec. 9, 2008

(54) METHOD OF SUPPRESSING INTERFERENCES IN SYSTEMS FOR DETECTING OBJECTS

(75) Inventor: Markus Wintermantel, Lindau (DE)

(73) Assignee: A.D.C. Automotive Distance Control Systems GmbH, Lindau (DE)

( * ) Notice: Subject to any disclaimer, the term of this patent is extended or adjusted under 35 U.S.C. 154(b) by 601 days.

(21) Appl. No.: 11/018,813

(22) Filed: Dec. 20, 2004

(65) Prior Publication Data

US 2006/0036353 A1 Feb. 16, 2006

Related U.S. Application Data

(63) Continuation of application No. PCT/DE03/02046, filed on Jun. 18, 2003.

(30) Foreign Application Priority Data

Jun. 18, 2002 (DE) ................. 102 50 607

(51) Int. Cl.
*G01S 13/04* (2006.01)
*G01S 13/06* (2006.01)
*G01S 13/08* (2006.01)
*G01S 13/18* (2006.01)
*G01S 13/50* (2006.01)
*G01S 13/93* (2006.01)
*G01S 7/00* (2006.01)

(52) U.S. Cl. .............. 342/27; 342/28; 342/70; 342/89; 342/94; 342/104; 342/105; 342/107; 342/108; 342/109; 342/110; 342/118; 342/134; 342/135; 342/136; 342/159; 342/175; 342/194; 342/195

(58) Field of Classification Search ........... 342/27, 342/28, 70–72, 89–103, 118, 134–145, 165–175, 342/189–197, 13–19, 88, 200–205, 104–117, 342/159–164; 367/87, 89–91, 93, 94, 99–105
See application file for complete search history.

(56) References Cited

U.S. PATENT DOCUMENTS 3,293,552 A 12/1966 Sichak et al.
3,324,251 A 6/1967 Sichak et al.
3,324,397 A 6/1967 Harvey
3,662,386 A * 5/1972 Bryant ............... 342/202

(Continued)

FOREIGN PATENT DOCUMENTS

| EP | 1 091 483 | 4/2001 |
|---|---|---|
| FR | 2556104 A2 * | 6/1985 |
| GB | 1023960 | 3/1966 |
| WO | 98/19177 | 5/1998 |

OTHER PUBLICATIONS

I.H. Donner, "Patent Prosecution:Practice & Procedure Before the U.S. Patent Office"; The Bureau of National Affairs, Inc.; Washington, D.C.; 1999; section titled "Hybrid Claims" on pp. 911-913.*

(Continued)

*Primary Examiner*—Bernarr E Gregory
(74) *Attorney, Agent, or Firm*—W. F. Fasse; W. G. Fasse

(57) ABSTRACT

In a method for suppressing interferences while detecting objects in a target area, a transmitter transmits a sequence of pulses into the target area, and a receiver detects the resulting reflection signal of the pulses reflected from the objects, within successive time windows that are referenced to the moment of transmitting an individual pulse and thus represent distance gates. The time spacing between the successive individual pulses is variable and randomized according to the pseudo-noise principle within predetermined limits, and the time windows are adapted accordingly. The received reflection signal may be sampled, digitized, digitally pre-processed and digitally filtered in the individual distance gates. A non-linear digital filter, preferably a sliding median filter, is used for the filtering to suppress transient disturbances. The median is determined from an odd number of consecutive sampled values of a reflection signal detected within a distance gate.

18 Claims, 13 Drawing Sheets

U.S. PATENT DOCUMENTS

| | | | | |
|---|---|---|---|---|
| 3,702,476 | A | * | 11/1972 | Nathanson et al. ........... 342/195 |
| 3,713,153 | A | * | 1/1973 | van Popta ..................... 342/88 |
| 4,049,953 | A | * | 9/1977 | Evans, Jr. .................... 342/137 |
| 4,072,949 | A | * | 2/1978 | Van Brunt .................... 342/15 |
| 4,214,242 | A | * | 7/1980 | Colin .......................... 342/137 |
| 4,323,897 | A | * | 4/1982 | Creighton et al. ........... 342/202 |
| 4,513,440 | A | | 4/1985 | Delman |
| 4,672,567 | A | | 6/1987 | Kelly et al. |
| 4,717,917 | A | | 1/1988 | Alitz |
| 4,723,553 | A | | 2/1988 | Miwa et al. |
| 4,875,050 | A | | 10/1989 | Rathi |
| 4,963,036 | A | | 10/1990 | Drisko et al. |
| 5,138,567 | A | | 8/1992 | Mehrgardt |
| 5,347,283 | A | * | 9/1994 | Krizek et al. ............... 342/201 |
| 5,534,867 | A | * | 7/1996 | Rose .......................... 342/17 |
| 5,983,082 | A | | 11/1999 | Hilbert |
| 6,369,633 | B1 | | 4/2002 | Tsukahara |
| 6,462,705 | B1 | * | 10/2002 | McEwan .................... 342/175 |
| 7,010,287 | B2 | | 3/2006 | Oh et al. |
| 7,072,921 | B2 | | 7/2006 | Kim |
| 7,072,928 | B2 | | 7/2006 | Kim |
| 7,260,593 | B2 | | 8/2007 | Kim |
| 2001/0034749 | A1 | | 10/2001 | Jiang |
| 2002/0063606 | A1 | | 5/2002 | Maria van Seijl |
| 2005/0138096 | A1 | | 6/2005 | Wintermantel |
| 2005/0156659 | A1 | | 7/2005 | Wintermantel |

OTHER PUBLICATIONS

C. L. Lee et al., "Bit-Sliced Median Filter Design Based on Majority Gate" IEE Proceedings G. Electronic Circuits & Systems, Institution of Electrical Engineers. Stevenage, GB, vol. 139, No. 1, Feb. 1992, pp. 63-71, XP000293218 ISSN: 0622-0039.

E. Ataman et al.: "A fast method for real-time median filtering" IEEE Transactions on Acoustics, Speech and Signal Processing, vol. 28, No. 4, Aug. 1980, pp. 415-421, XP001160948 New York US.

* cited by examiner

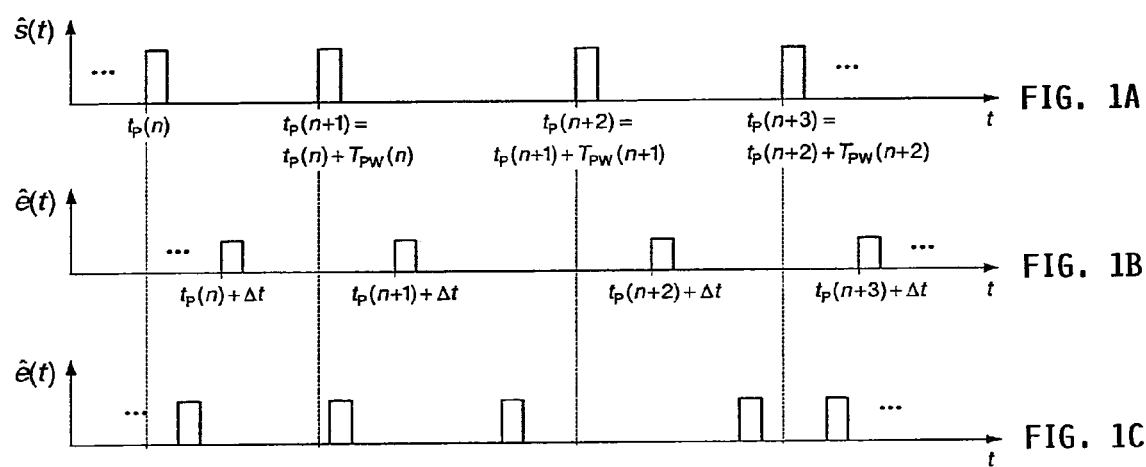

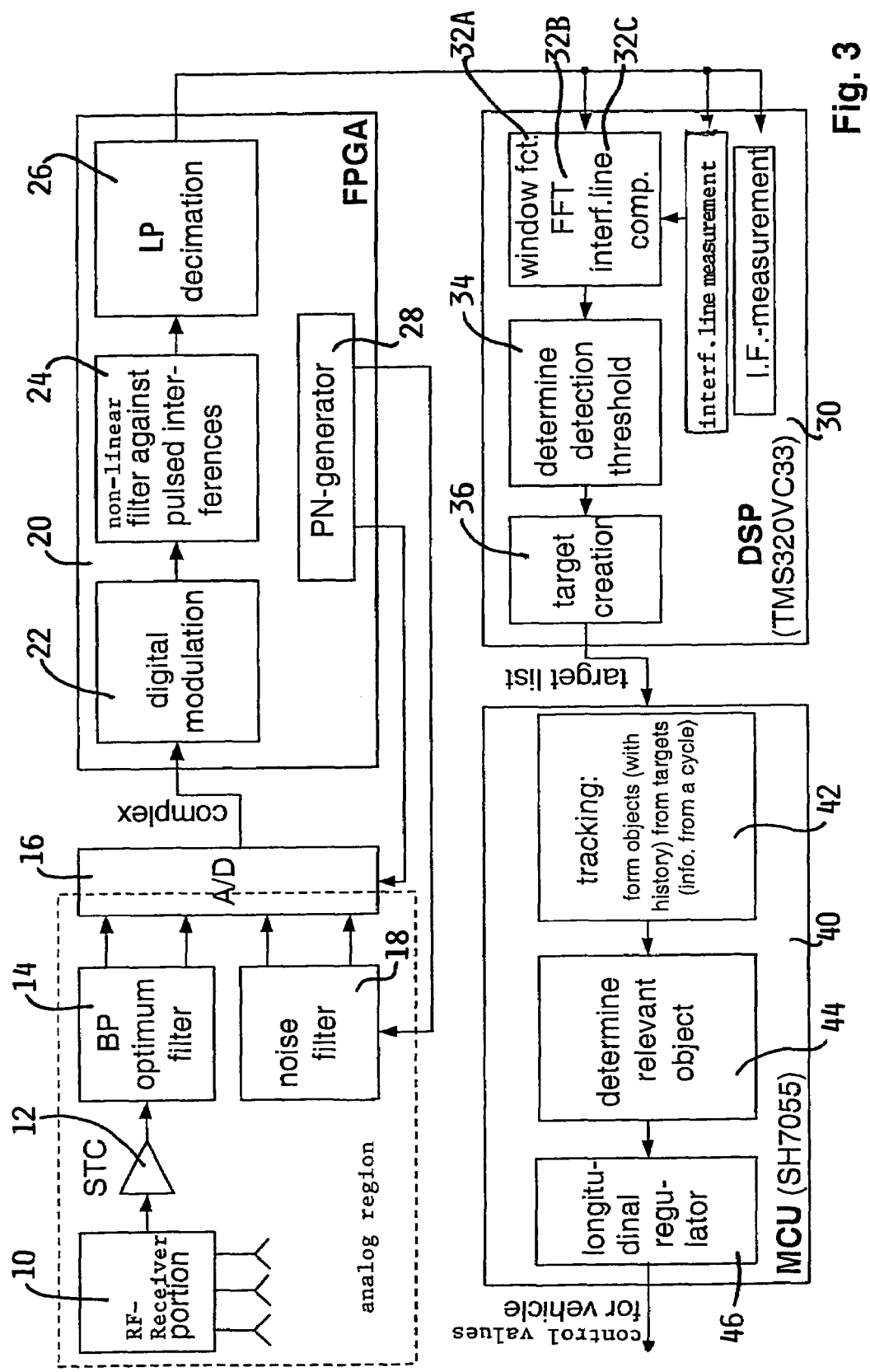

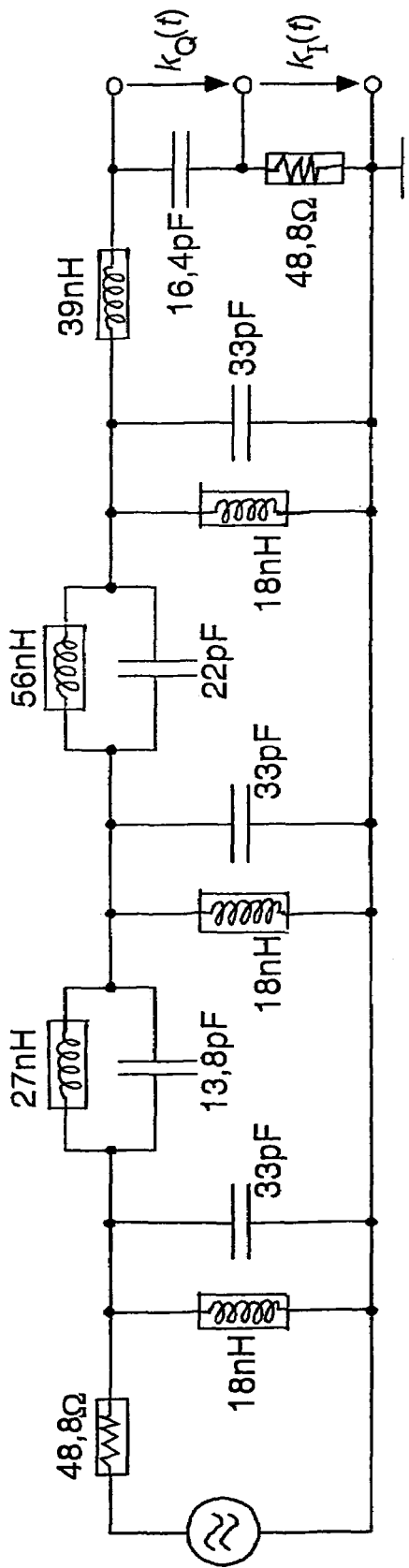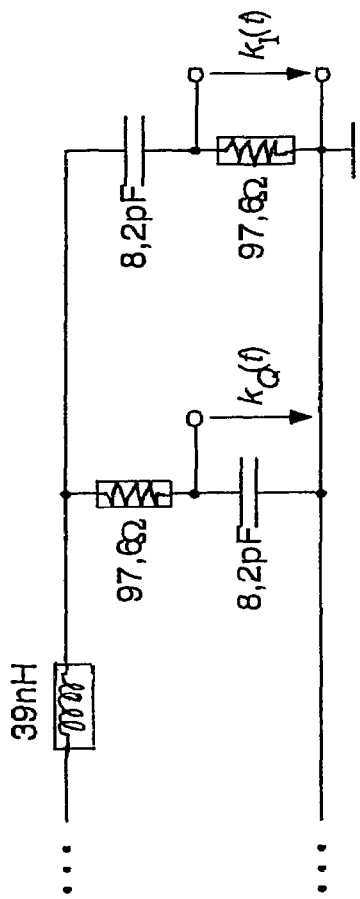
Fig. 7
Fig. 8

Fig. 9A
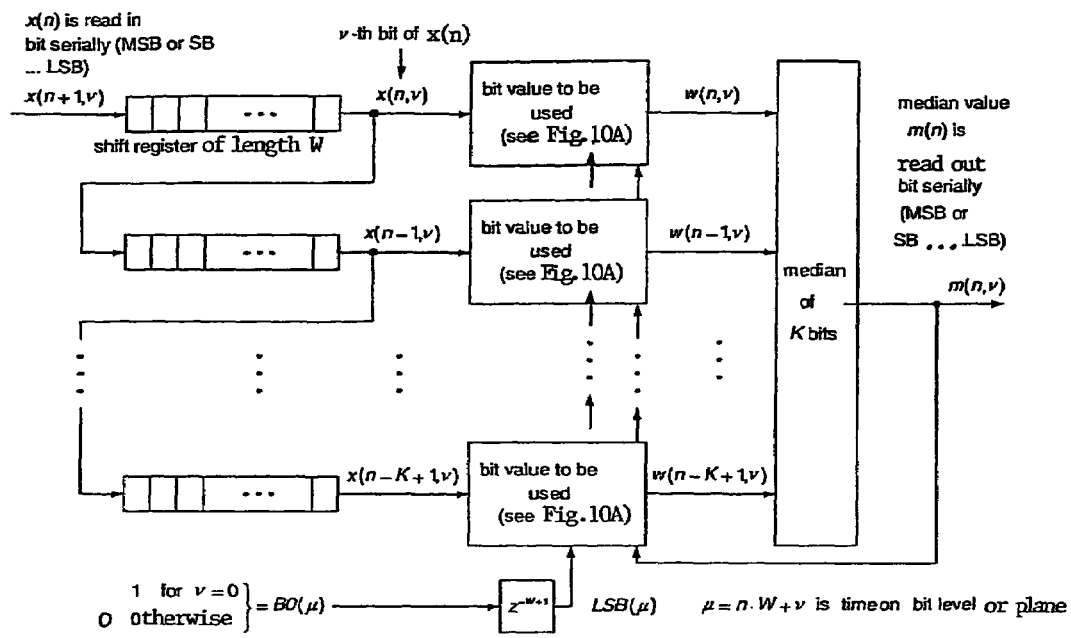
blocks "bit value to be used" in Fig. 9A:
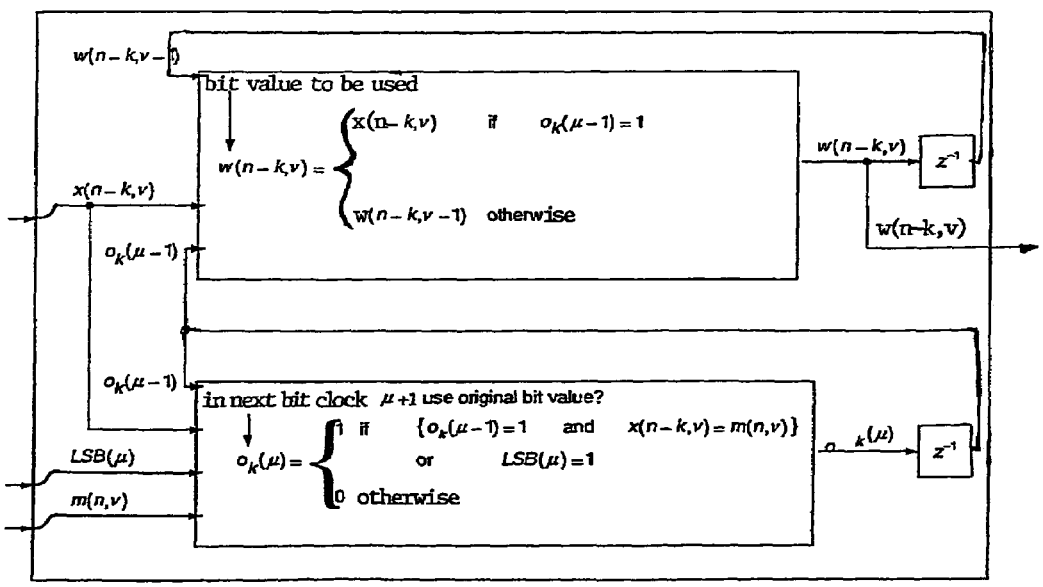
Fig. 10A

Fig. 9C
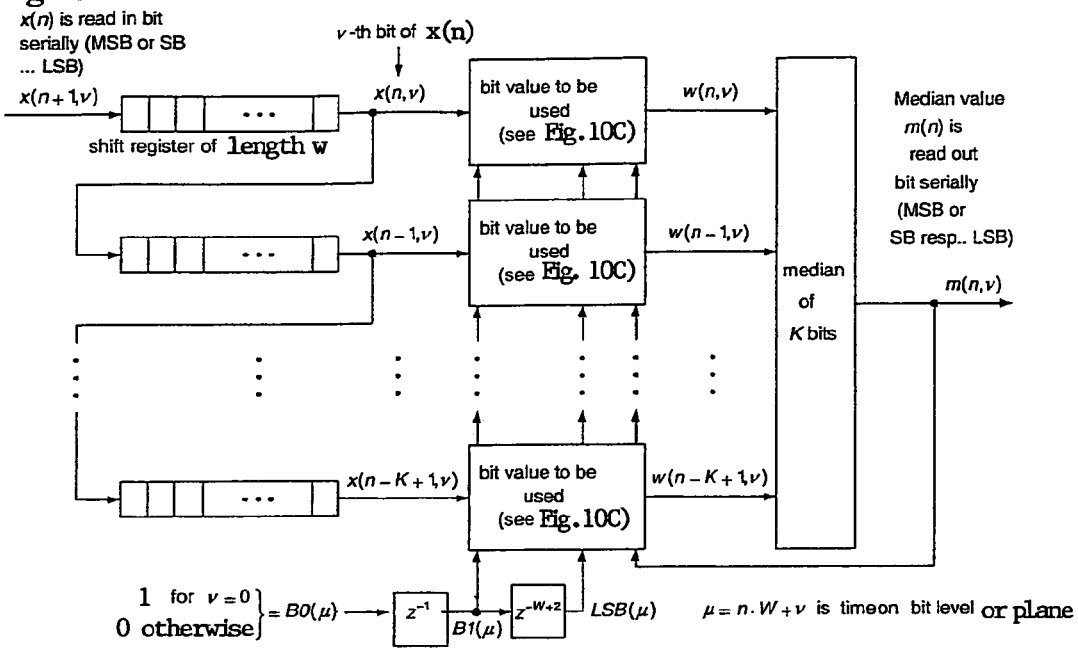
blocks "bit value to be used" in Fig. 9C:
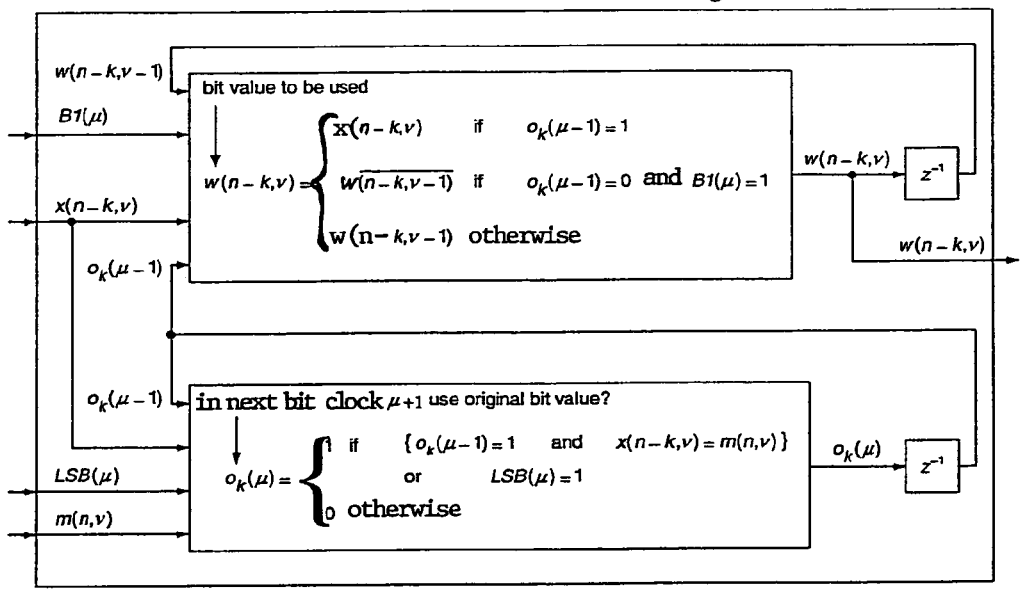
Fig. 10 C

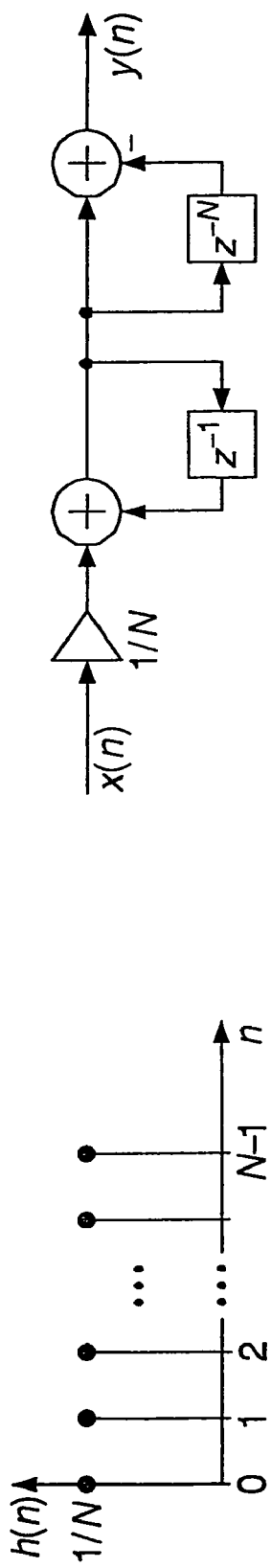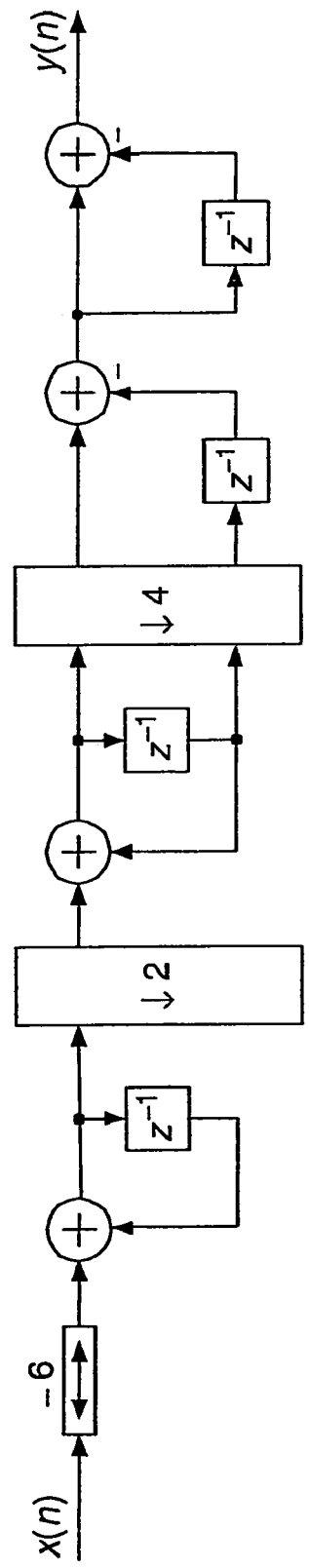
FIG. 12A
FIG. 12B
FIG. 13

METHOD OF SUPPRESSING INTERFERENCES IN SYSTEMS FOR DETECTING OBJECTS

CROSS-REFERENCE TO RELATED APPLICATIONS

This application is a Continuation under 35 U.S.C. §111, 120 and §365 of PCT International Application PCT/DE03/02046, filed on Jun. 18, 2003, which designated the United States, and which was published in a language other than English. The entire disclosure of that PCT International Application is incorporated herein by reference. Also, this application is related to U.S. application Ser. No. 11/018,844 filed on Dec. 20, 2004 and issued as U.S. Pat. No. 7,274,922 on Sep. 25, 2007, and to U.S. application Ser. No. 11/018,865 filed on Dec. 20, 2004.

PRIORITY CLAIM

This application claims the foreign priority under 35 U.S.C. §119 of German Patent Application 102 50 607.8, filed on Jun. 18, 2002. The entire disclosure of that German Patent Application is incorporated herein by reference.

FIELD OF THE INVENTION

The invention relates to a method for suppressing interferences in systems to detect objects in a target area, in which a sequence of pulses is transmitted by at least one transmitter into the target area and the reflection signals of the pulses are detected by at least one receiver within several time windows representing respective distance gates.

BACKGROUND INFORMATION

Systems to detect objects detect the distance, the relative velocity, the relative angle or the image information of objects in the target area. Systems are used for this purpose, which radiate waves and evaluate their echoes. In doing so, waves of different physical nature (e.g. sound waves or electromagnetic waves) and different wavelength (with electromagnetic waves, e.g. in the range of infrared or radar) are put to use.

Systems of this types are used in particular for regulating the distance and the driving speed of vehicles.

If a wave with the propagation velocity c is reflected on an object, e.g. on a vehicle running ahead at a distance a, after the running or transit time $\Delta t = 2a/c$ the system receives the reflected and in general damped wave $e(t)$. Thus one can conclude or ascertain the distance of the object from the running time $\Delta t$, as long as the running time $\Delta t$ is always smaller than the pulse repeat time $T_{PW}(n)$. Otherwise, ambiguity problems do arise—they are referred to as trappings or super-range readings. If the object detected by the wave moves with the relative velocity v relative to the measuring system, then the reflected wave received by the system shows a frequency shift by the Doppler frequency $f_D = 2f_s v/c$. Thus one can conclude or ascertain the relative velocity v from the Doppler frequency $f_D$.

In practice in motor vehicle applications, apart from trappings there is a further interference with an identical effect, namely if several vehicles with systems of this type meet each other so that pulses of the other systems of other vehicles are received by the system of the vehicle of interest.

Linear filtering is not suitable for suppressing such interferences, as on the one hand it only smooths the disturbances and on the other hand the spectral and power analysis already generally represents a linear filtering of minimum bandwidth.

SUMMARY OF THE INVENTION

Therefore, it is an object of the invention to disclose an improved method for suppressing interferences of this type. This object is achieved according to the invention by randomly encoding the time distance or time spacing between the successive individual pulses in accordance with the pseudo-noise principle within predetermined limits, and accordingly adapting the time windows, and carrying out a sampling, a digitization, if necessary a digital pre-processing, and subsequently a digital filtering of the received reflection signal in the individual distance gates, and using a non-linear digital filter for the filtering for suppressing transient disturbances. Advantageous further embodiments are apparent from the claims.

For diminishing the influence of trappings and of interferences, i.e. reciprocal disturbances, of pulsed systems working in the same frequency range, with respect to each other, at first a pseudo-noise encoding of the pulse repeat time $T_{PW}(n)$ is applied, i.e. the pulse repeat time is not constant, but is variable according to a random process. Received pulses, which derive from trappings or from another pulsed system, then exhibit a (time) spacing from the pulse transmitted directly before, which is not always identical but rather is variable with a stochastically distributed duration.

This measure alone, however, is not sufficient to suppress trappings and interferences to an adequate extent. With trappings and interferences by pulsed systems working in the same frequency range (with or without pseudo-noise encoding), due to the pseudo-noise encoding of the pulse repeat time $T_{PW}(n)$, generally only single or individual sampled values are disturbed in each distance gate—they are called transient disturbers or interferences. But in the case of high degrees of interference, this could already suffice to make the results of the further signal processing (spectral analysis for Doppler determination e.g. by means of FFT or power analysis e.g. by power integration) useless.

For solving this problem, the invention further provides particularly a non-linear digital filtering of the digitized signal (if necessary, after an adequate digital pre-processing, such as e.g. a value squaring for a power analysis), which specifically eliminates the transient interferences. Only in combination and cooperation with this non-linear digital filtering does the special advantage of the pseudo-noise encoding become especially effective, as the interference power is not merely stochastically distributed, but also this portion or component is effectively reduced due to the now transient interferences.

Preferably, a median filtering is used, in which the median is determined from a respective odd number of consecutive sampled values of a reflection signal detected within a distance gate. Median filtering proves to be efficient and effective and, moreover, can be easily implemented. The median of an odd number K of values is the middle value among the several values, i.e. the $(K+1)/2$–smallest value or, what is identical, the $(K+1)/2$–largest value, which in general is different from the mean or average value. For instance, for the five values 5, 3, 2, 79 and 1, the median is the value 3, while the mean or average is 18.

Preferably, a median filter is used which is short in relation to the maximum useful frequency, to be able to reconstruct the superimposed sinusoidal oscillation from the sampled values without significant damping. Preferably, median filters of a length between 3 to 9 values are used. With such short median filters it has been proven to be particularly advantageous when a multi-step or multi-stage median filter is used, in which determination of the median is repeated, i.e. is effected at least two times after another, ensuring in this way a better filter effect with simultaneous low damping. Preferably, a sliding median filter with overlapping windows of the input values is used, i.e. in case of a predetermined length of the filter, only a smaller number (compared to the length of the filter), of examined old input values is replaced by new input values. In particular, a sliding median filter with the step range 1 (i.e. without decimation of the sampling rate) can also be used. In this case, compared to the previous median determination, only the oldest input value respectively is replaced by the current new input value for carrying out the new median determination. This fully maintains the resolution. A two-step or two-stage median filter with a length of 5 values in each stage and a step range of 1 proves to be already extremely effective for the considered applications. Preferably, an oversampling is performed within each distance gate.

As an alternative to median filtering, further filters are suitable, which must be non-linear in order to damp especially only transient interferences.

BRIEF DESCRIPTION OF THE DRAWINGS

Hereinafter the invention will become apparent from the description of example embodiments taken in conjunction with the drawings.

FIG. 1A shows an amplitude or envelope ŝ(t) of the transmitted wave for the case of rectangular pulses;

FIG. 1B shows an amplitude or envelope ê(t) of the received wave for the case of an object at the distance a, which results in a signal running or transit time of $\Delta t=2a/c$;

FIG. 1C shows a received signal ê(t) disturbed by interference for example due to trappings or interferences from another pulsed system working in the same frequency range;

FIG. 3 is a block circuit diagram of a pulse modulated Doppler radar system;

FIG. 7 is a circuit diagram of a first example embodiment of an optimum filter;

FIG. 8 is a circuit diagram of a second, preferred example embodiment of an optimum filter;

FIG. 9A shows an algorithm for implementing a median filter with a bit serial processing for binary data in a sign-less binary representation;

FIG. 9B shows an algorithm for implementing a median filter with a bit serial processing for binary data in a sign-value or sign-magnitude representation;

FIG. 9C shows an algorithm for implementing a median filter with a bit serial processing for binary data in a one's or two's complement representation;

FIGS. 10A, 10B and 10C respectively show details of the block determining the bit value to be used for FIGS. 9A, 9B and 9C;

FIGS. 12A and 12B show the pulse response h(n) of a sliding-type mean value generator as well as a signal flow chart;

FIG. 13 shows an advantageous example embodiment of a decimation low-pass; and

DETAILED DESCRIPTION OF PREFERRED EXAMPLE EMBODIMENTS AND OF THE BEST MODE OF THE INVENTION

In FIG. 1A for a pulsed system, the amplitude or envelope ŝ(t) of the transmitted wave of the frequency $f_s$ is shown for the case of rectangular pulses. The moments at which the transmit pulses begin are designated herein with $t_P(n)$. The distance, i.e. the time spacing, between two consecutive pulses is called the pulse repeat time $T_{PW}(n)$.

If this wave with the propagation velocity c is reflected on an object at the distance a, after the running or transit time $\Delta t=2a/c$ the system receives the reflected and in general damped wave e(t). In FIG. 1B the amplitude or envelope ê(t) of the received wave is shown. Thus one can conclude or ascertain the distance of the object from the running time $\Delta t$, as long as the running time $\Delta t$ is always smaller than the pulse repeat time $T_{PW}(n)$; otherwise ambiguity problems do arise—they are referred to as trappings. If the object detected by the wave moves with the relative velocity v relative to the measuring system, then the reflected wave received by the system shows a frequency shift by the Doppler frequency $f_D=2f_sv/c$. Thus one can conclude or ascertain the relative velocity v from the Doppler frequency $f_D$.

In FIG. 1C, the amplitude or envelope ê(t) of the received wave is exemplified for trappings or interferences of another pulsed system operating in the same frequency range.

The starting point for the improved method of the invention is a pseudo-noise encoding of the pulse repeat time $T_{PW}(n)$, i.e. the pulse repeat time is not constant, but is variable according to a random process. Received pulses, which derive from trappings or from another pulsed system, then exhibit a time spacing or delay after the pulse transmitted directly before, which is not always identical but rather has a duration that is stochastically distributed.

Preferably, the received signal e(t) is sampled after being suitably processed (e.g. by mixing to an intermediate frequency or into the base band, IQ-production, filtering). For this purpose the sampling times or moments are chosen such that they have a time spacing $t_A(m)$, $m \in \{0, 1, \ldots, M-1\}$ with regard to the preceding transmit pulse time $t_P(n)$; each time spacing $t_A(m)$, $m \in \{0, 1, \ldots, M-1\}$, corresponds to a so-called distance gate. For each of the M distance gates altogether N(m) sampled values are produced per cycle; it is not relevant for the further examination in which manner this is effected, i.e. whether serially or parallel.

Figure 2A:
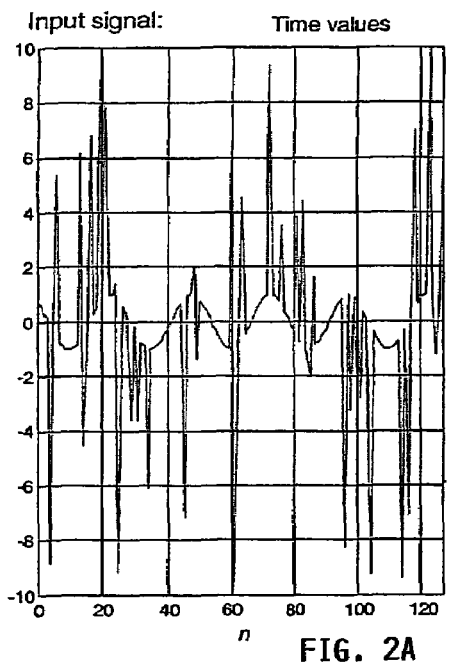
FIG. 2A shows a sinusoidal oscillation of the input signal with numerous high interfering pulses superimposed thereon in the discrete time domain.
Figure 2B:
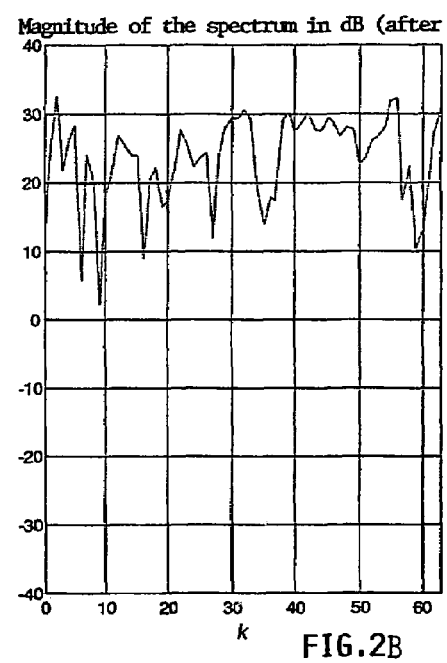
FIG. 2B shows the spectrum of the resulting signal, in which the spectral peak of the sinusoidal oscillation has disappeared in the noise produced by the interfering pulses.

With trappings and interferences by pulsed systems working in the same frequency range, due to the pseudo-noise encoding of the pulse repeat time $T_{PW}(n)$ generally only individual sampled values are disturbed in each distance gate—they are called transient disturbers. But in the case of high interference levels, this could suffice for the further signal processing (spectral analysis for Doppler determination e.g. by means of FFT or power analysis e.g. by power integration) to deliver useless results. FIG. 2A shows by way of example a sinusoidal oscillation in the discrete time domain, which is superimposed by numerous high interfering impulses; in the spectrum of the resulting signal shown in FIG. 2B, the spectral peak of the sinusoidal oscillation has disappeared in the noise produced by the interfering pulses.

This is when the median filtering can be applied. Preferably, the median filter lengths shall be chosen ever larger, the more values could be disturbed; with a power analysis the median filter lengths can be chosen as far as to the number N(m) of sampled values, while in the case of a spectral analysis for Doppler determination the median filter lengths are limited by the maximum Doppler frequency to be detected (due to the low-pass character of median filters), which necessitates oversampling.

Figure 2C:
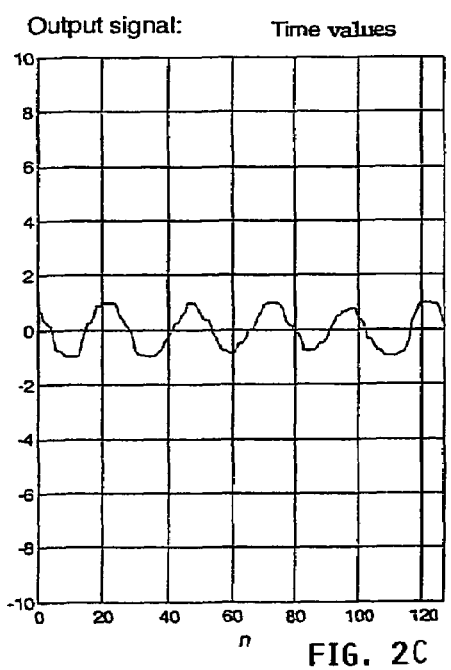
FIG. 2C shows an output signal after a two-stage median filtering with a respective filter length of K=5, in which the sinusoidal oscillation in the time domain is nearly completely reconstructed, and is thus clearly visible in the spectrum shown in FIG. 2D.
Figure 2D:
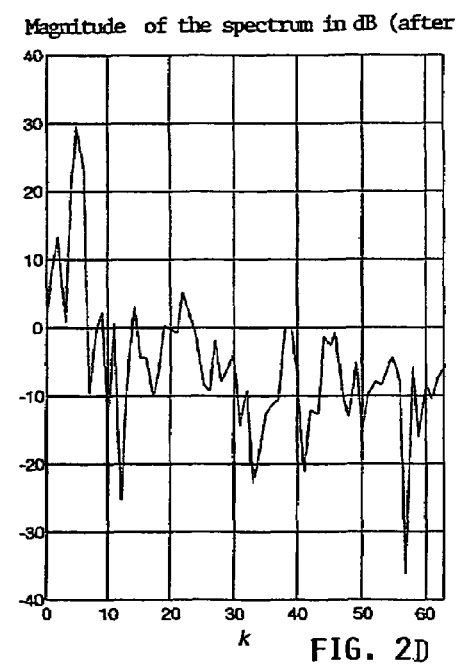

For the disturbed signal as shown in FIG. 2A, the course shown in FIG. 2C results after filtering in a two-stage median filter with a respective filter length of K=5. The useful signal, a sinusoidal oscillation, is nearly completely reconstructed in the time domain of FIG. 2C and thus is clearly visible in the spectrum of FIG. 2D.

Consequently, if the pseudo-noise encoding of the pulse repeat time is combined with the median filtering as a non-linear filtering suitable for suppressing transient disturbers, the influence of trappings and interferences by pulsed systems working in the same frequency range can be strongly diminished or entirely eliminated. Moreover, at first preferably an adequate pre-processing of the sampled values is provided in each distance gate, such as e.g. a value squaring for a power analysis.

Hereinafter the invention shall be presented in an example embodiment when being used in a radar system in particular for a passenger car.

Modern motor vehicles are increasingly provided with a distance control system based on radar, which detects the distance, velocity and relative angle of the motor vehicle running ahead.

A known radar system of such kind for instance is the FMCW-system (Frequency Modulated Continuous Wave) developed by the company Bosch, in which two physical values, i.e. the distance and the relative velocity of a moving or standing body, are mapped to one physical value, i.e. the frequency. For this purpose signals are permanently transmitted and the signals reflected by the moving body are received. Conclusions can be drawn as to the searched values (i.e. values of interest to be determined) from the frequency response curve of transmitted and received signals and from the frequency difference of these signals respectively. A separation of velocity and distance is possible by evaluating several signals, the so-called chirps, with different frequency slope. Two chirps would be sufficient for a single target. For multi-target situations at least three chirps are needed.

For operating a radar system of such type in particular an oscillator (VCO) with low phase noise is required, which provides preferably linear frequency ramps, what is not possible offhand and what makes the RF-part of the radar system very elaborate. In traffic situations with many different targets, as it is often the case with guardrails and in city centers, problems arise with the target detection and separation, as all targets are present in an antenna radiation in each associated chirp spectrum. Therefore, exact extraction of the different targets is not possible or it does not always meet one's expectations.

To avoid these problems, the pulse modulated Doppler radar system provides a solution. With this method a target is mapped to one or more consecutive distance gates. The received signal is sampled appropriately. The exact distance can then be gained from the amplitude ratio of the sampled values in consecutive distance gates.

However, the pulse modulated Doppler system has a low signal-to-noise ratio (S/N) based on the reduced medium or average output power. Due to the broadband receiving path, this radar system is also more sensitive to interferences.

For recognizing the sign of the velocity, the pulse modulated Doppler method performs complex sampling of the received signal. Radar systems according to the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding its phase and amplitude noise can be used, and as no frequency ramps have to be produced.

With such a radar system, for a measuring cycle, a plurality, e.g. 1024, of transmit pulses are evaluated or analyzed per reception antenna. Their (time) spacing is then e.g. 2.5 µs. In addition, the (time) spacing is pseudo-noise encoded to avoid trappings and interferences.

When using a large number of transmit pulses, more accurate velocity measuring and a high integration gain are possible and beyond that, the noise produced due to the pseudo-noise encoding is low so that a more optimum signal-to-noise ratio can be achieved.

Figure 14:
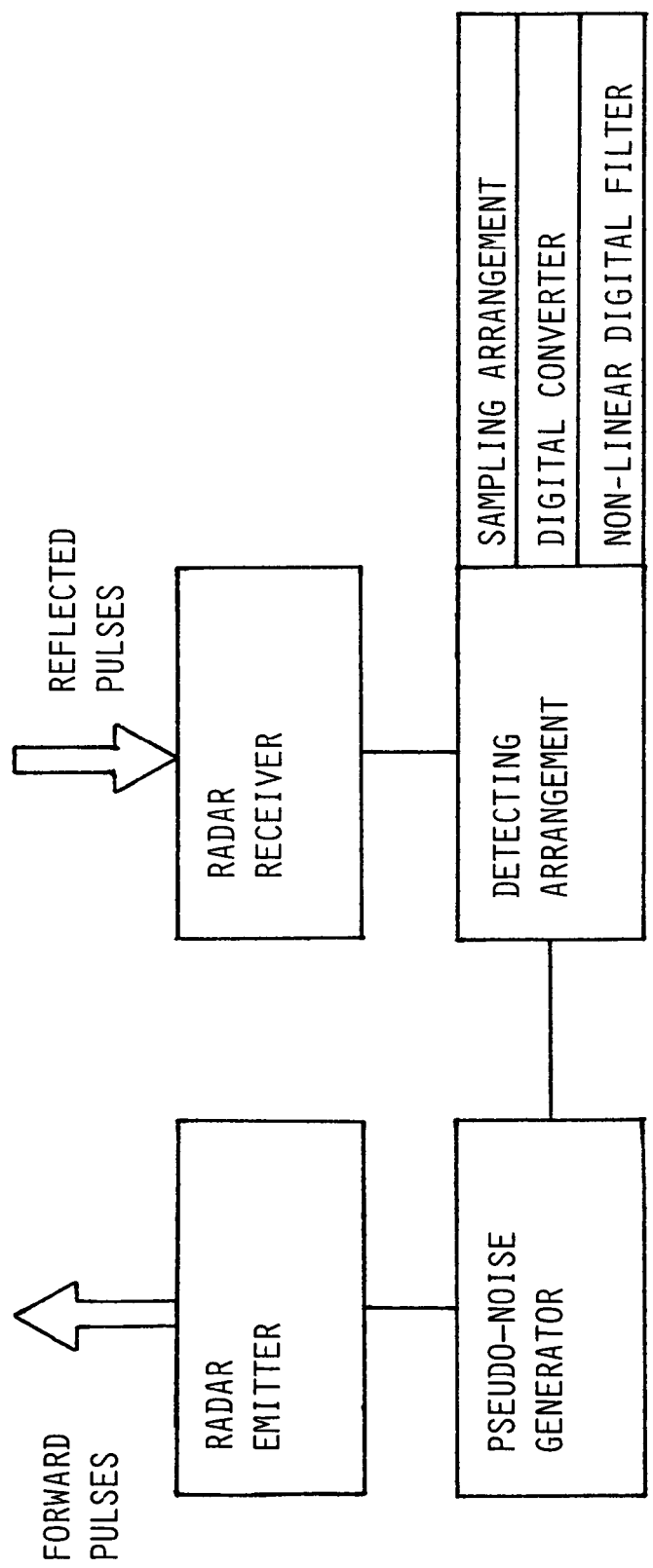
FIG. 14 is a block diagram representing a radar system embodying the inventive features.

On the basis of a block diagram, FIG. 3 shows the pulse modulated Doppler radar system in accordance with the invention. The individual elements of this system, in particular the optimum filter and the elements of the FPGAs are described in detail below. In alternative embodiments, instead of the radar emitter and the radar receiver for emitting and receiving radar pulses as shown in FIG. 14, the system may comprise an infrared optical emitter and an infrared optical receiver for emitting and receiving infrared light pulses, or an ultrasonic emitter and an ultrasonic receiver for emitting and receiving ultrasonic pulses.

The radar system comprises an RF-reception or receiver part 10 with a downstream amplifier 12, band pass optimum filter 14 and A/D converter 16. At the output of the A/D converter 16, a complex output signal can be picked off or tapped, which can be fed to a downstream FPGA 20. The FPGA 20 includes a digital modulation system 22, the median filter 24 against interferences in the form of pulses, and a decimation filter 26 embodied as a low-pass, which are arranged and connected in series. The FPGA unit 20 further includes a PN (pseudo noise) generator 28. In addition, a noise filter 18 is provided, which precedes the A/D converter 16.

After the FPGA 20, a digital signal processor (DSP) 30 is next in line, and in the present case comprises a system for producing a window function 32A, an FFT-system (Fast Fourier Transformation) 32B as well as an interference line compensator 32C. Subsequently, starting from this the detection threshold is determined in block 34 and is fed to a system 36 for targeting, which produces a target list. Next in line after the DSP 30 is a micro controller unit (MCU) 40, which, starting from the target list, produces control values for the vehicle as needed. For this purpose, at first tracking of the target list is performed in block 42, and a relevant object is determined in block 44. The information on this is fed to a longitudinal controller or regulator 46, which then produces the desired control values. The function of the DSP 30 and of the MCU 40 can, of course, alternatively be fulfilled by a single program-controlled unit, for instance by a micro computer.

Figure 4:
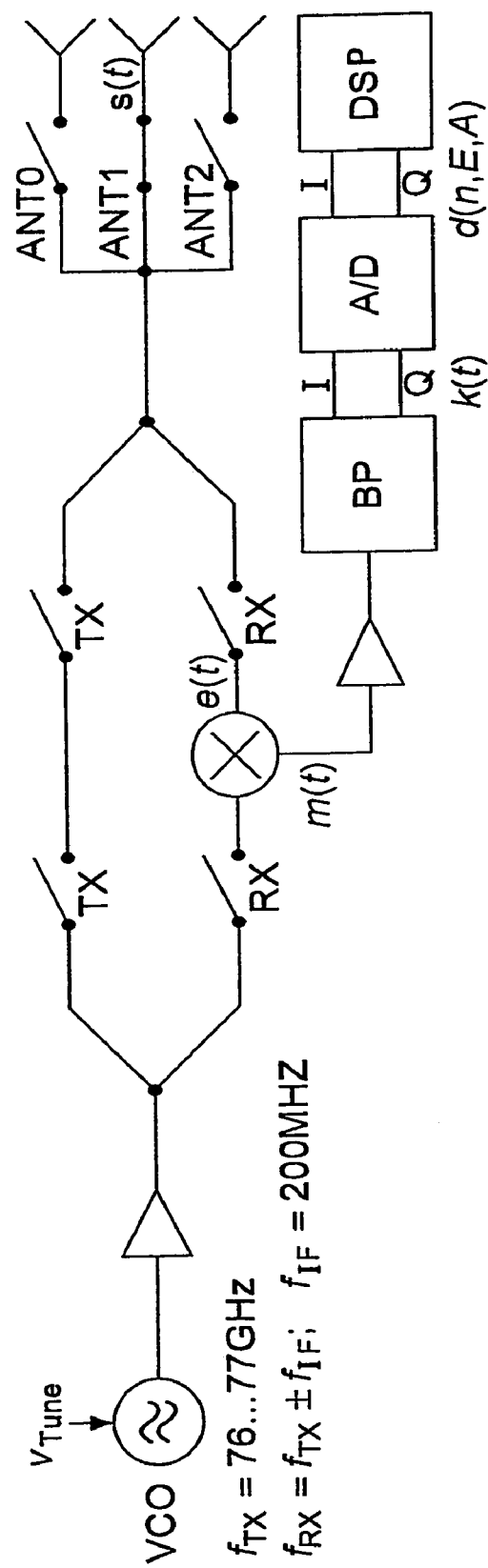
FIG. 4 is a simplified schematic circuit diagram for explaining the principle of the Doppler method.
Figure 5A:
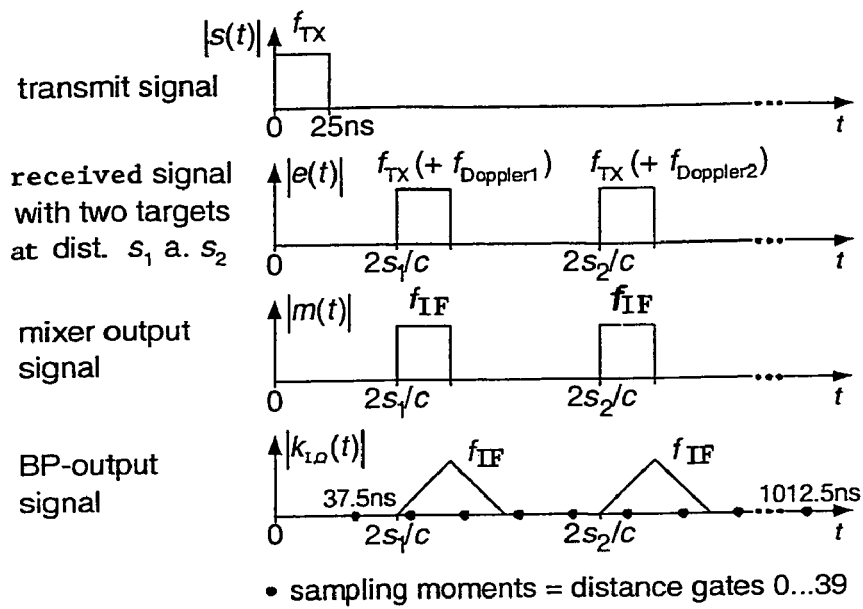
FIGS. 5A, 5B and 5C are signal-time/sample graphs for the several identified signals in the circuit diagram according to FIG. 4.
Figure 5B:
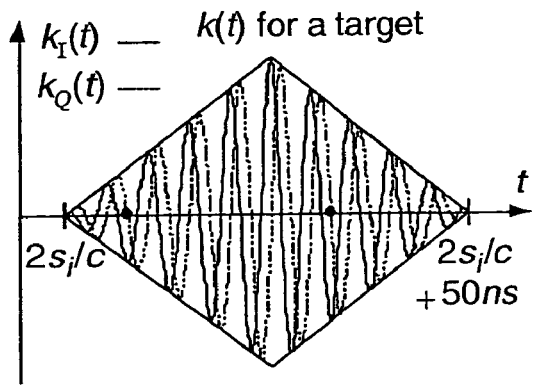
Figure 5C:
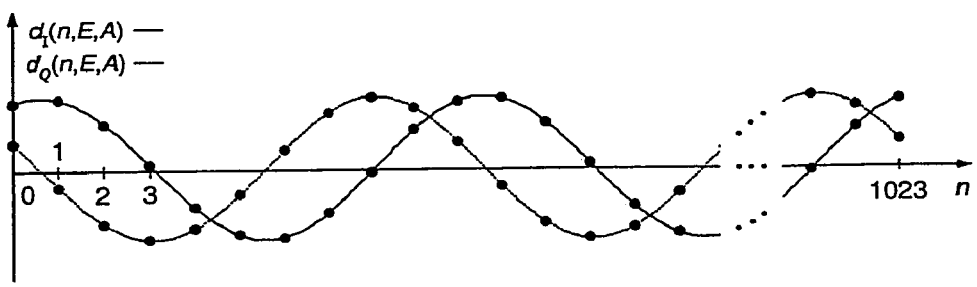

Hereinafter the Doppler method shall be described in short by way of FIGS. 4 and 5. FIG. 4 shows by way of a simplified diagram the principle of the Doppler method and FIGS. 5A, 5B and 5C show the signal-time graph for the signals in the diagram according to FIG. 4.

With the Doppler method, a complex sampling of the received signal is performed to recognize the sign of the velocity. Radar systems with the pulse modulated Doppler method are characterized in that the velocity and the distance represent direct measured quantities. Compared to the FMCW-system mentioned above, the RF-part can be implemented more easily, as here a free-running oscillator (VCO) with low requirements regarding phase and amplitude noise can be used, and as no frequency ramps have to be produced.

A measurement cycle takes for example 50 ms each. The measuring result is a target list, i.e. a snapshot of the traffic situation. To each measurement cycle, 5 measurement blocks are associated, namely an interference line measurement block, an I.F.-measurement block as well as three antenna measurement blocks (one for each antenna). Each of these measurement blocks takes 2.76 ms. In this time for instance 1024+64 transmit pulses are produced, the first 64 transmit pulses serving for the start-up transient effect of the filters and thus not being used for evaluation. After each transmit pulse, sampling is performed 40 times at intervals of 25 ns each. This ensures that each target is detected in at least one distance gate.

Via the switches ANT0 to ANT2 one of the three antennas is selected. By closing the transmit switches TX for 25 ns, the signal of the oscillator is provided to the selected antenna and is then radiated from this antenna.

After this transmitting of a rectangular transmit pulse, the reception switches RX are closed and the frequency of the oscillator is changed by 200 MHz. In this way the received pulses are transformed via the mixer to an intermediate frequency of 200 MHz. The Doppler shift of the frequency must not be considered at this point. The real signal m(t) resulting this way is transmitted to a passive band pass embodied as an optimum filter, which has two outputs orthogonal to each other with an identical amplitude and thus produces the complex signal k(t), i.e. an IQ-signal without a complex mixing has been realized.

After each transmit pulse, the IQ-signal at the output of the band pass filter is sampled 40 times at time spacings or intervals of 25 ns. The individual sampling times or moments correspond to one distance range each—they are so-called distance gates with a width of 3.75 m which reach as far as to a distance of 150 m. As a rectangular receiving pulse with a length of 25 ns is smoothed by the band pass filter to a triangular pulse of double the length and thus is generally visible in two consecutive distance gates, the exact distance can be interpolated by analyzing or evaluating the amplitude ratio of these two distance gates (see FIG. 5B).

For detecting the relative velocity of the targets with regard to one's own vehicle and for increasing the signal-to-noise ratio, the complex receiving signals of 1024 consecutive transmit pulses are analyzed in each distance gate E, without changing the selected antenna A. For the case of equidistant transmit pulses, FIG. 4 shows the real and imaginary part $d_I(n, E, A)$ and $d_Q(n, E, A)$ of the 1024 complex sampled values $d(n, E, A)$ of one distance gate, in which there is a relatively moving target. During the short observation period of 2.56 ms for the 1024 sampled values the relative velocity can always be considered as constant. The phase changes uniformly from sampled value to sampled value, as the distance of the target and thus the phase of the receiving pulse change uniformly— exactly the Doppler frequency including its sign results (since the signal is complex).

The method just described is used sequentially for each of the three antennas. One of the antennas is oriented or "looks" exactly straight forward, whereas the two others are directed somewhat to the left and right respectively to be able in this way to determine the position of the detected targets relative to one's own driving lane.

The received signal always contains an interference portion or component, which can be noticed as a noise. The interference has approximately the characteristics of random white noise. In order to filter out this noise as well as possible, i.e. to achieve a maximum signal-to-noise ratio, an optimum filter is used. Its transfer function corresponds to the spectrum of the received intermediate frequency pulses (I.F.-pulses), i.e. to the spectrum of a rectangle modulated at 200 MHz with the pulse length 25 ns. Thus the optimum filter corresponds to a band pass.

Advantageously, the utilized optimum filter is realized as an LC-quadrupole embedded in ohmic resistances. In the examined frequency range this is an especially low-cost and flexible technology, as the inductances needed here are available as SMD-components. With this the filter circuit can be established in a very simple, small and thus also cost-effective manner.

When designing an optimum filter of this type in accordance with the known method according to Bader, two design strategies are possible:

1. At first a low-pass adapted to the requirements is designed. Subsequently, from it the low-pass is transformed into a band pass. However, this model is only contingently suitable and only for special circuits, as it leads to structures and component values that are unsuitable for implementing the circuit.
2. Direct design of a band pass filter: This model is in particular advantageous, although somewhat complex in its design, as it leads to different alternative structures, which, depending on the requirements, are more or less well adapted to the demanded circumstances. With this method at first an approximation of the ideal transfer function is performed.

Figure 6:
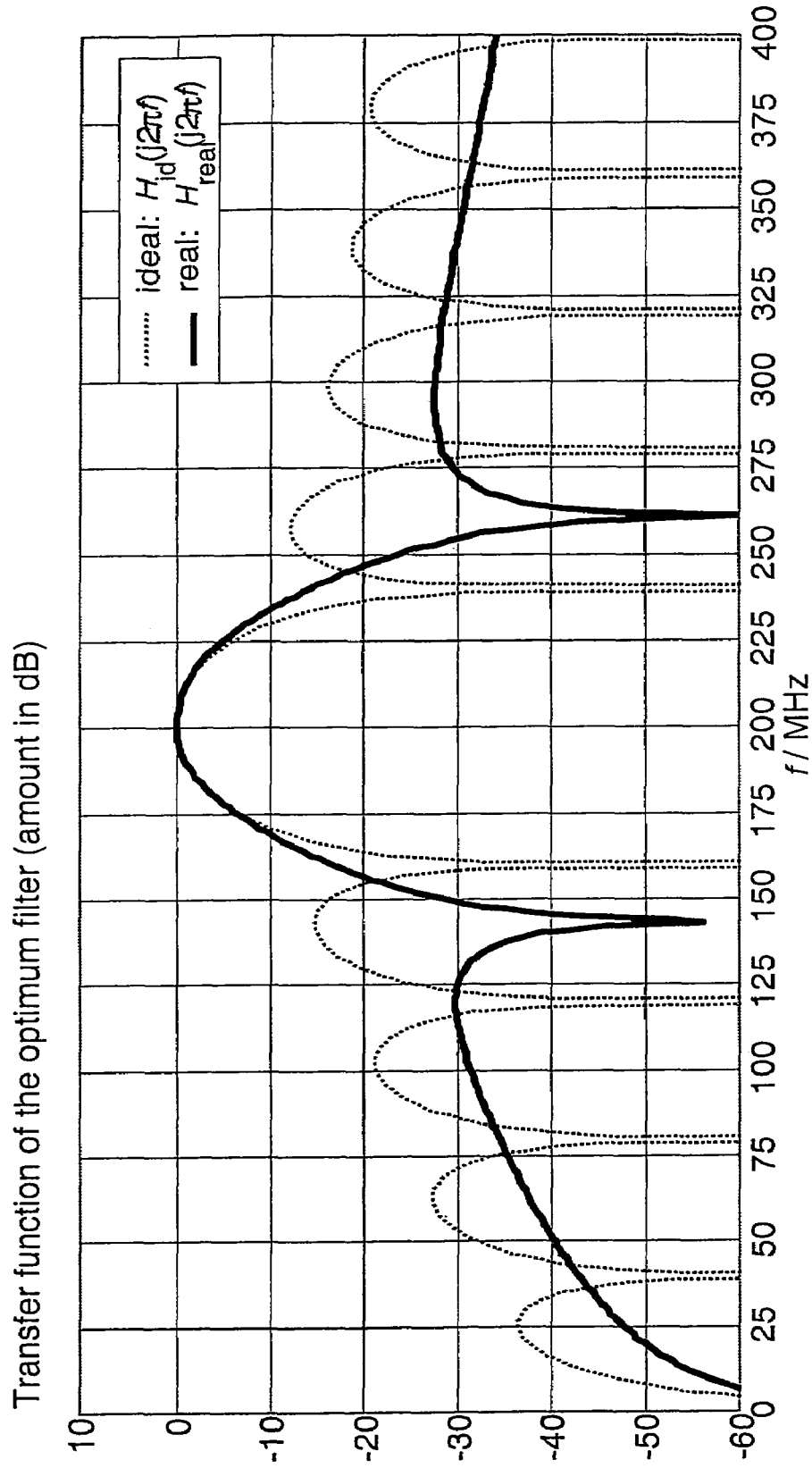
FIG. 6 shows the transfer functions of an ideal and of a real optimum filter.

FIG. 6 shows in dashed lines the transfer function of an optimum filter produced in the direct design; whereas the thin continuous curve belongs to the ideal optimum filter, which is approximated and reproduced very well by the real circuit.

FIG. 7 shows a first circuit arrangement for the implementation of an optimum filter approximated in accordance with Bader; here the values of the inductances, capacitances and resistances are rounded to real available values. Degrees of freedom in development have been exploited here such that advantageously no transformer is necessary. Contrary to its dual structure, the structure shown in FIG. 7 has ground capacitances from nearly all nodes, in which the stray capacitances can be included.

The output signals $k_I(t)$ and $k_Q(t)$ of the circuit in FIG. 7 are mutually orthogonal, i.e. they have a phase difference of 90° to each other, and have an identical amplitude at the intermediate frequency $f_{IF}$=200 MHz, what can be achieved by means of degrees of freedom in the design and development.

The complex output signal $k_I(t)+j*k_Q(t)$, hereinafter called the IQ-signal, thus is a complex oscillation for the real input oscillation with the intermediate frequency $f_{IF}$. This so-called IQ-signal has been implemented in an advantageous manner without any mixing.

It is particularly advantageous if the parts of the output signal respectively associated with the real part and the imaginary part, i.e. $k_I(t)$ and $k_Q(t)$, are embodied grounded. By way of a circuit diagram, FIG. 8 shows a second preferred example embodiment of an approximated optimum filter, which takes this demand into account. Basically, the output-side part of the filter circuit has been doubled in this regard.

The further great advantage of this modified output stage shown in FIG. 8 is that the I/Q-character of the output signal is maintained despite the ohmic and capacitive load by the A/D converter. Merely the filter characteristic changes marginally.

Consequently, a band-pass optimum filter embodied according to FIGS. 7 and 8, in summary, comprises the following advantageous functions:

The filter has an optimized signal-to-noise ratio.

The filter produces, in a simple but quite reliable manner, an IQ-signal that is accurate to the greatest possible extent, which can be picked off or tapped at the output of the filter.

As the rectangular output signal is visible in two distance gates, and as the distance can be determined via the amplitude ratio, easy interpolation of the distance is possible in this way.

In FIG. 3, the FPGA block 20 comprises a system 22 for digital modulation of the complex output signal produced by the optimum filter 14. A system of this type is necessary since the velocity range of interest typically is not symmetric and as a result would lead to an asymmetric frequency range; in the example of use given herein, velocities in the range of −88.2 to +264.7 km/h are of interest. By means of a frequency offset of −12.5 kHz a symmetric frequency range can be produced from it. By means of a suitably dimensioned system for digital modulation this can be implemented, for instance by multiplication of the sampled IQ-signal with a signal, which is produced by a circulating complex phasor of the amplitude 1 and the rotary frequency −12.5 kHz.

The FPGA block 20 further comprises a non-linear filter 24 against interferences in pulse form. Pulse interferences are caused e.g. in trappings or pulse-radar systems of other road users. Pulse interferences are distributed to all distance gates (more or less uniformly) by a pseudo-noise encoding of the sampled moments. Thereby, only individual values are disturbed by interference in each distance gate. Undesired pulse interferences can be compensated by pseudo-noise encoding and by non-linear filtering, for instance by median filters.

For implementing the filter 24 against pulse interferences the following difficulty is to be considered. In this case a linear filter is hardly advantageous, since the decimation low-pass 26 succeeding the filter is already a linear filter with a minimum bandwidth. All non-linear filters that can compensate individual error values may be used according to the invention; however, many of these filters are problematic with regard to stability and implementation on an FPGA.

Here, advantageously a one- or multi-step or- stage median filter is to be used. In a preferred embodiment this filter is two-step with a respective length of 5 values in each step or stage. Advantageously, oversampling is performed by the preceding A/D converter.

The median of K values is the middle value, i.e. the (K+1)/2−smallest value=(K+1)/2−largest value among the K values.

For instance, the median of the five numbers 5, 3, 2, 79, 1 is the (5+1)/2 smallest (or largest) number, i.e. the $3^{rd}$ smallest (or largest) number among the five numbers, namely the number 3. A sliding median filter without reduction of the sampling rate computes at each moment n the median of K consecutive values of an input sequence x(n) and produces from it an output signal m(n). Many algorithms are known for median filters, which are particularly suitable for a software implementation. They are based on sorting with an accompanying high computing time or statistic analysis with accompanying high memory capacity for data. For a hardware implementation these algorithms are hardly suitable, as they typically require too many case differentiations and branchings.

However, a new algorithm for a hardware implementation of a median filter has been developed now: the operating mode will be described below by way of FIGS. 9A, 9B, 9C and 10A, 10B, 10C. Those figures show an algorithm for implementing a bit serial processing to determine the median. With such structure the expenditure and effort for a median filter can be clearly reduced in many cases, in particular if the maximum clock time of the FPGA is significantly larger than the word cycle of the input signal. A further advantage is the simple scalability of the structure.

Figures 9B, 10B:
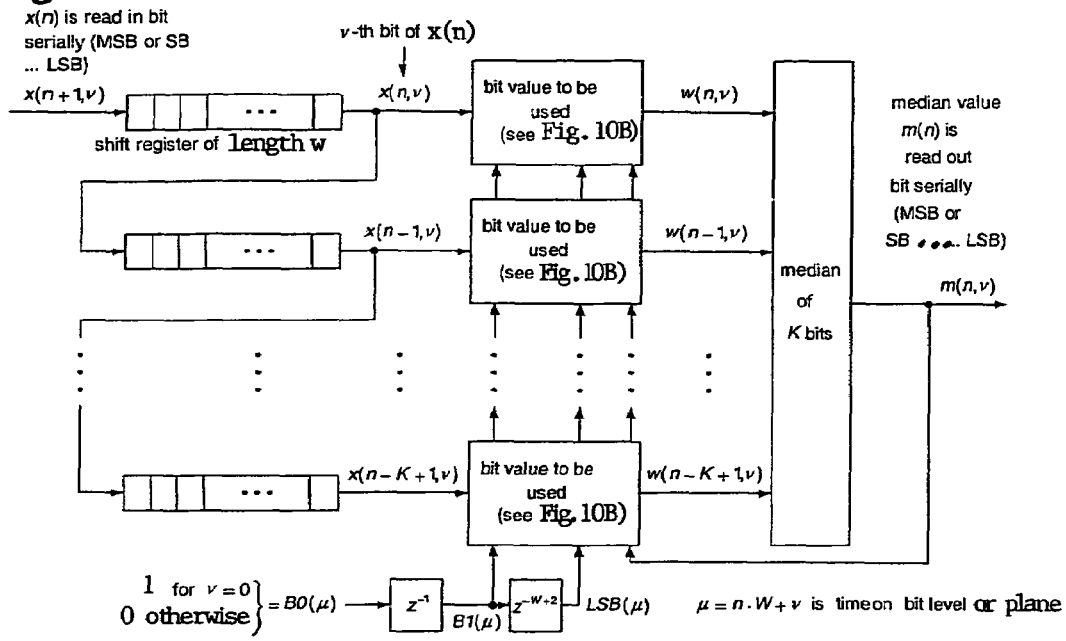

In FIGS. 9A, 9B, 9C as well as in FIGS. 10A, 10B, 10C, versions of the filter algorithm for calculating the median are shown in the form of a one-dimensional filter without decimation, FIG. 9A combined with FIG. 10A showing the configuration for input values in a sign-less binary representation, while FIG. 9B combined with FIG. 10B showing the modification for a sign-value representation of the input values, and FIG. 9C combined with FIG. 10C showing the modification for a one's or two's complement representation of the input values. The following issues are noted for the sake of explanation.

The input signal x(n) and the output signal consisting of the median values m(n) have the word length W, i.e. each time value consists of W bits. The individual bits are numbered with v, starting with vv=0 for the MSB (most significant bit) in a binary representation which has no sign in FIGS. 9A, 10A and in a one's or two's complement representation in FIGS. 9C, 10C, or for the SB (sign bit) in a sign-value representation in FIGS. 9B, 10B, and ending with v=W-1 for the LSB (least significant bit). The bit v of x(n) and m(n) is identified by x(n, v) and m(n, v) respectively.

Time is identified by n on the level or plane of input and output signals, i.e. on the word level or plane, while time is identified by µ=n·W+v on the bit level or plane.

The processing is bit serial, i.e. one bit after the other is processed, starting with the MSB or SB as applicable and ending with the LSB. Consequently, the entire filter structure, i.e. memory and logic, are clocked with the bit time µ.

The input values required for calculating the median are stored bit by bit with the aid of K consecutive shift registers of the length W; here K is the median filter length.

Flag B0(µ) marks the processing of bit 0; for v=0 it is 1 or otherwise it is 0. Flags B1(µ) and LSB(µ) mark the processing of bit 1 and of the LSB respectively; they are defined in an analogous manner and can be generated by delaying B0(µ) by one and W−1 clocks, respectively.

In the block "median of K bits" the median is produced bit by bit, i.e. the majority of zeros or ones among the K bits fed-in is determined.

In the $k^{th}$-block "bit value to be used" (k=0, 1, . . . , K−1 is viewed from the top), which in detail is shown in FIGS. 10A, 10B and 10C respectively, on the one hand the $k^{th}$-bit value w(n−k, v) for the bit by bit producing of the median is determined: this is either the original value x(n−k, v), i.e. the examined bit v from the input value x(n−k), or an accordingly modified value. On the other hand it is determined whether in the next bit clock µ+1 the original value or an accordingly modified value is to be used, which is marked by the flag $o_k(µ)$=1 for the modification not effected so far and $o_k(µ)$=0 for the modification already effected. Here, the rule according to the procedure as described above is taken into consideration, i.e. that after the first use of a modified value this value has to be used thereafter until the end of the respective time step n. Subsequently, i.e. with LSBμ=1 the flag is reset, i.e. for the next output value at first the unmodified input value is again taken into consideration.

Initialization of the memories (shift register as well as delayer or delay line) depends on the desired starting behavior of the filter.

Hereinafter this new median filter structure shall be considered in terms of its expenditure and complexity in case of a hardware implementation (e.g. on an ASIC or FPGA).

The bit by bit producing of the median, i.e. the determination of the majority of zeros or ones among the K bits fed-in, is the central block of this structure. A possible strategy for implementing this block, suitable in particular for larger filter lengths K, is based on summation of the bit values (which are each either 0 or 1). If the bit sum is $\geq(K+1)/2$, then the bit median is 1, otherwise it is 0; the comparison can be implemented via subtraction and subsequent checking for conformity with regard to the sign. The summation of the bits, for instance, can be implemented in graduated parallel form, in which the number of the parallel single adders diminishes and their word length increases from step to step; on the one hand that minimizes the critical path and thus the required passing or throughput transit time and on the other hand keeps the required word lengths and thus the expenditure as low as possible. Minimization of the critical path is particularly important in case a high clock time of the filter is demanded, as the bit by bit producing of the median lies in a recursive loop and, therefore, pipelining must be excluded. For small filter lengths there are special solutions optimized for the used hardware for implementing the bit by bit producing of the median. As an example to be explained next, the filter length is K=5 and the implementation is carried out on a commercially available FPGA, which as a basic module has look-up-tables (LUTs) with four logic inputs and a logic output. In such a case, three of these LUTs are required for the bit by bit producing of the median.

The K identical blocks "bit value to be used" require each only two delayers or delay lines (FIFOs) as well as a very simple logic (in the above example 2 LUTs).

The K shift registers for storing the input values require in many cases (in particular if the word length W is relatively large) considerably higher expenditure than the rest of the filter structure, what speaks in favor of the efficiency of the filter logic. It has to be noted that storing K input values in each median filter is necessary, independent of the structure.

The new median filter is scalable, provided that the bit by bit determination of the median is implemented via summation. Namely, if the filter length K is changed, merely the number of the shift registers being used, the number of the identical blocks "bit value to be used", the number of the bits to be added up, as well as the value to be compared with the bit sum have to be adapted.

The new median filter structure has the characteristic or feature that the producing of the median for each input value, i.e. each time step n, is restarted completely from the beginning, which means that contrary to the most common structures it does not resort to results of previous time steps; for instance with sorting procedures in general it is started from the sequence determined in the preceding cycle. Due to this feature, the new algorithm for calculating a median is especially suitable for filtering with decimation. For this purpose in the filter structure only the shift registers are to be fed with values in a modified manner. Thus with a decimation by the factor L=2, the two top shift registers are to be fed in parallel with two consecutive input values, and in the coupling of the shift registers one of them is respectively skipped. With a decimation by the median filter length, i.e. L=K, the shift registers are no longer coupled, but are fed parallel with K consecutive input values. With decimation, the clock rate of the input signal x(n) that can be processed at maximum by the filter structure can be increased by the decimation factor L.

For hardware implementation of the digital filter, the new algorithm for calculating the median in many cases leads to considerable reduction of the required expenditure; this mainly depends on the clock rate and on the word length of the input signal, on the degree of decimation, the technology being used and the available logic.

The FPGA block 20 in FIG. 3 further comprises a decimation filter 26. Advantageously, the decimation filter 26 is embodied as a low-pass (LP). In the present example embodiment, a decimation of the sampling frequency of 400 kHz to 50 kHz is performed, i.e. by the factor 8. This enables an improvement of the signal-to-noise ratio by 9 dB, in the case of an ideal decimation low-pass.

Figure 11:
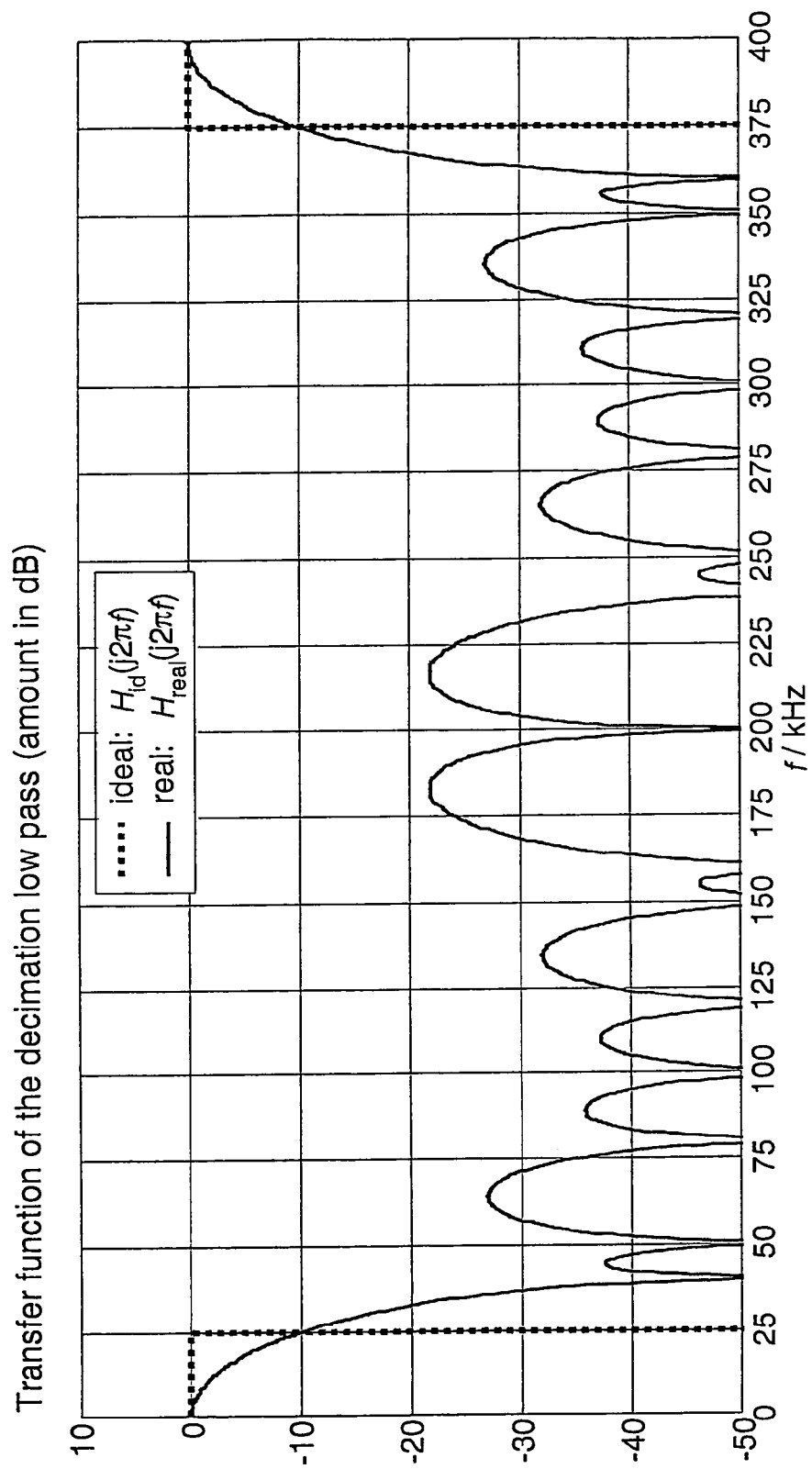
FIG. 11 shows the transfer functions of an ideal and of a real decimation low-pass.

A real decimation low-pass must meet the requirements of signal flanks or edges that are as steep as possible around the frequencies of about f=±25 kHz. It is not necessary that $|H_{real}(j2\pi f)|\approx$constant in the transmission or pass band |f|<25 kHz, as in the analysis or evaluation merely spectra are evaluated and in doing so amplitude errors can be compensated in an easy manner. In FIG. 11 the transfer functions of an ideal and of a real decimation low-pass are shown. The low-pass used here consists of two sliding-type mean value generators, the second already working with the halved input clock rate. The sliding-type mean value generator of the length N averages over the current value and the N−1 preceding values. FIG. 12A shows the pulse response h(n) of such a sliding-type mean value generator, and FIG. 12B shows a pertinent signal flow graph. The mean value generator can be implemented very efficiently in recursive form.

The entire structure of an advantageous example embodiment of a decimation low-pass is shown in FIG. 13. An absent factor 64/40 at the output is also implemented in a subsequent windowing for the digital Fourier Transformation (DFT). Consequently, for a decimation filter of this type with the degree 15, the following elements must be provided: a shifter, four adders, and four memory elements. However, a multiplier is not required. As a comparison, with a usual linear-phased filter with the degree 15, altogether eight multipliers, 15 adders, and 15 memories must be provided. Therefore, the decimation filter is also characterized by a clearly lower circuit expenditure.

In the above example, a median filter for suppressing transient interferences has been used. Alternative non-linear digital filtering methods shall be introduced below. So, for instance, an assessed or estimated value is determined successively for each sampled value by extrapolation from the sampled values preceding it, the examined sampled value is compared with its associated estimated value, and if the examined sampled value deviates from its associated estimated value by more than a predetermined threshold, then this sampled value is recognized as being transiently disturbed (i.e. affected by transient interference) and is therefore replaced by its associated estimated value.

If, as in the application described above, a complex signal with an I-portion or I-component and a Q-portion or Q-component is produced from the received reflection signal, as an alternative, it is also possible to determine the power respectively for a sampled value from the I- and Q-portions, and to compare this determined power with an average power value averaged over several preceding sampled values, and in case of a deviation of the determined power from the average power value by more than a prescribed threshold, then the current actual sampled value is recognized as being transiently disturbed and is replaced by a value extrapolated from the preceding sampled values.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of detecting an object in a target area, with interference suppression, said method comprising the features:
    a) emitting a sequence of forward pulses into said target area so as to impinge on said object and reflect from said object to form reflected pulses, wherein said forward pulses are emitted successively at respective pulse emission times with variable time spacings respectively between successive ones of said forward pulses;
    b) randomly setting respective durations of said variable time spacings in accordance with a pseudo-noise encoding within a predetermined limited duration range;
    c) receiving, with a receiver, said reflected pulses to form a received reflection signal;
    d) detecting said reflected pulses of said received reflection signal within plural time windows that are respectively time-referenced in succession from each respective one of said pulse emission times of each respective one of said forward pulses, so that said time windows respectively represent distance gates of successive distance ranges between said receiver and said object;
    e) matching a time-referencing of said time windows respectively to said variable time spacings for said successive ones of said forward pulses forming successive ones of said reflected pulses; and
    f) carrying out at least sampling, digitizing and digital filtering of said received reflection signal respectively in each one of said time windows, wherein said digital filtering comprises a non-linear digital filtering adapted to suppress transient interferences and to produce filtered output values in a filtered reflection signal.

2. The method according to claim 1, wherein said feature f) further comprises digitally pre-processing said received reflection signal before said digital filtering.

3. The method according to claim 1, wherein said sampling of said received reflection signal produces a succession of sampled values, and said non-linear digital filtering comprises median filtering that determines a respective median value among a respective odd number of consecutive ones of said sampled values in a respective one of said time windows.

4. The method according to claim 3, wherein said median filtering is carried out with said odd number of said sampled values being from 3 to 9.

5. The method according to claim 3, wherein said median filtering is a multi-step filtering that determines said median value in multiple filtering steps respectively taking into account successive stepped sets of said odd number of said consecutive ones of said sampled values in said respective one of said time windows.

6. The method according to claim 5, wherein said multi-step filtering includes exactly two of said filtering steps that each respectively have said odd number of said sampled values being 5.

7. The method according to claim 3, wherein said median filtering is a sliding median filtering with successive overlapping windows of said output values.

8. The method according to claim 1, wherein said sampling comprises an over-sampling in each one of said time windows.

9. The method according to claim 1, further comprising performing a decimation filtering followed by a spectral analysis of said filtered reflection signal.

10. The method according to claim 1, further comprising performing a power analysis of said filtered reflection signal.

11. The method according to claim 1, wherein said sampling of said received reflection signal produces a succession of sampled values, and said non-linear digital filtering comprises, respectively in succession for each one of said sampled values:
    respectively determining a respective estimated value of a given sampled value among said sampled values by extrapolating from a plurality of said sampled values preceding said given sampled value;
    respectively comparing an actual value of said given sampled value with said estimated value of said given sampled value to determine any deviation therebetween; and
    if said deviation exceeds a prescribed threshold, then replacing said actual value of said given sampled value with said estimated value of said given sampled value, to produce said filtered output values in said filtered reflection signal.

12. The method according to claim 1, wherein said sampling of said received reflection signal produces a succession of sampled values, and further comprising:
    producing from said received reflection signal a complex signal having an I-component and a Q-component;
    determining, from said I-component and said Q-component, a respective actual power for each respective one of said sampled values;
    respectively in succession for each given sampled value among said sampled values, determining a respective average power as an average of said respective actual powers of a plurality of said sampled values preceding said given sampled value;
    comparing said actual power of said given sampled value with said average power of said sampled values preceding said given sampled value to determine any deviation therebetween; and
    if said deviation exceeds a prescribed threshold, then replacing an actual value of said given sampled value with an extrapolated replacement value that is extrapolated from a plurality of said sampled values preceding said given sampled value, to produce said filtered output values in said filtered reflection signal.

13. The method according to claim 1, wherein:
    said sampling and digitizing of said received reflection signal produces a succession of binary digital input values of said received reflection signal;
    said input values are represented in a binary fixed point representation in which successive bit values respectively of said input values descend respectively by a factor of ½ from a most-significant bit to a least-significant bit, said bit values include only 0s and 1s, and said binary fixed point representation may optionally further include a sign bit; and
    said non-linear digital filtering comprises a median filtering of respectively K successive ones of said input values.

14. The method according to claim 13, wherein said median filtering comprises:
- for each one of individual bits among said input values, beginning with said sign bit if present or otherwise with said most-significant bit and proceeding successively in descending value of said individual bits to said least significant bit, respectively checking whether, over all of said K successive input values, more 1s or 0s occur as said bit value of a presently examined bit of said individual bits;
- specifying as a respective median value bit at a given bit position corresponding to said presently examined bit, of a median value of said K successive input values, either a 1 or a 0 being a more-prevalent bit value which occurred more frequently in said checking; and
- for those of said input values for which said bit value of said presently examined bit does not correspond with said more-prevalent bit value, assigning the respective median value bit of all subsequent bits progressing toward said least-significant bit to be either:
  - a minimum value that can be represented with said subsequent bits, if, with regard to values represented by said presently examined bit and said subsequent bits, said respective input value is not greater than said median value, whereby in said binary fixed point representation including said sign bit, when said presently examined bit is not said sign bit, a sign of said median value is calculated into said bit values represented by said presently examined bit and said subsequent bits; or
  - a maximum value that can be represented with said subsequent bits, if, with regard to values represented by said presently examined bit and said subsequent bits, said respective input value is not less than said median value, whereby in said binary fixed point representation including said sign bit, when said presently examined bit is not said sign bit, a sign of said median value is calculated into said bit values represented by said presently examined bit and said subsequent bits.

15. In a method of detecting an object in a target area including emitting a succession of forward pulses into said target area, receiving a reflection signal including reflection pulses arising from a reflection of said forward pulses from said object, and evaluating said reflection pulses to detect at least one of a relative distance, a relative position, and a relative speed of said object,
the improvement comprising:
- randomly setting respective variable time spacings between successive ones of said forward pulses according to a pseudo-noise randomization; and
- carrying out a non-linear digital filtering of said reflection signal to suppress transient interferences therein.

16. A method for suppressing interferences in systems to detect objects in a target area, in which:
a) with at least one transmitter CANT0, ANT1, ANT2) a sequence of pulses (s(t)) is transmitted into the target area and with at least one receiver the reflection signals (e(t)) of the pulses are detected within several time windows, the time windows being directed each in terms of the moment of sending the single pulses and thus representing a distance gate respectively, wherein
b) the time distance $(T_{PW}(n)=t_p(n+1)-t_p(n))$ between the single pulses $(t_p(n+1), t_p(n))$ is random coded in accordance with the pseudo-noise principle within predetermined limits and the time windows are adapted accordingly,
c) and a sampling, a digitalization, and subsequently a digital filtering of the received reflection signal is performed in the individual distance gates, for the filtering a non-linear digital filter being used for suppressing transient disturbances.

17. The method according to claim 16, characterized in that the reflection signal is detected and sampled, is digitalized in an analog-digital converter and thus a sequence of binary digital input values of the reflection signal is produced, wherein
d) the input values are available in a binary representation in fixed point format, in which the amount of the bit significances descends from a maximum significant bit (MSB) to a less significant bit (LSB) with a factor ½ respectively, only the bit values 0 and 1 occur and an additional sign bit (SB) may be provided,
e) and the median filtering of K consecutive input values respectively is performed, in which
f) for the single bits starting with the sign bit (SB), if present, or otherwise with the maximum significant bit (MSB) consecutively in terms of a bit significance descending in value as far as to the less significant bit (LSB),
g) it is checked whether for the actively examined bit viewed over all K input values more ones or zeros occur as a bit value,
h) the bit value occurring more frequently representing the bit value of the actively examined bit of the median,
i) and for those input values, for which the bit value of the actively examined bit does not correspond to the bit value occurring more frequently, for all succeeding bits with regard to the sequence according to d):
the minimum value that can be represented by these bits is used, if with regard to the values presented by the actively examined and the succeeding bits the respective input value does not exceed the median; for number representations examined bit is not the sign bit (SB), the sign of the median is to be included into the bit significances for the values presented by the actively examined and the succeeding bits,
the maximum value that can be represented by these bits is used, if with regard to the values presented by the actively examined and the succeeding bits the respective input value does not lie below the median; for number representations with the sign bit (SB), in case the actively examined bit is not the sign bit (SB), the sign of the median is to be included into the bit significances for the values presented by the actively examined and succeeding bits.

18. A radar system for detecting an object in a target area, comprising:
- a radar emitter adapted to emit radar pulses as a sequence of forward pulses into said target area so as to impinge on said object and reflect from said object to form reflected pulses, wherein said forward pulses are to be emitted successively at respective pulse emission times with variable time spacings respectively between successive ones of said forward pulses;
- a pseudo-noise generator adapted to randomly set respective durations of said variable time spacings in accordance with a pseudo-noise encoding within a predetermined limited duration range;
- a radar receiver adapted to receive said reflected pulses to form a received reflection signal;
- an arrangement adapted to detect said reflected pulses of said received reflection signal within plural time windows that are respectively time-referenced in succession from each respective one of said pulse emission times of each respective one of said forward pulses, so that said time windows respectively represent distance gates of successive distance ranges between said receiver and said object, and adapted to match a time-referencing of said time windows respectively to said variable time spacings for said successive ones of said forward pulses forming successive ones of said reflected pulses; and a sampling arrangement, a digital converter, and a non-linear digital filter adapted to carry out at least sampling, digitizing and non-linear digital filtering of said received reflection signal respectively in each one of said time windows, wherein said non-linear digital filtering is adapted to suppress transient interferences and to produce filtered output values in a filtered reflection signal.

* * * * *

UNITED STATES PATENT AND TRADEMARK OFFICE
CERTIFICATE OF CORRECTION

PATENT NO. : 7,463,181 B2  Page 1 of 1
APPLICATION NO. : 11/018813
DATED : December 9, 2008
INVENTOR(S) : Wintermantel It is certified that error appears in the above-identified patent and that said Letters Patent is hereby corrected as shown below:

Column 10,
Line 33, after "with", replace "vv " by --v--;
Lines 37, 38, 39, 42, 50, 61, 62 and 63, replace "v" by --v--;

Column 15,
Line 56, after "transmitter", replace "CANT0," by --(ANT0,--;

Column 16,
Line 37, after "representations", insert --with the sign bit (SB), in case the actively--.

Signed and Sealed this

Ninth Day of November, 2010

David J. Kappos
*Director of the United States Patent and Trademark Office*